United States Patent
Lai et al.

(10) Patent No.: US 7,300,315 B2
(45) Date of Patent: Nov. 27, 2007

(54) STRUCTURE OF INTERFACE CARD CONNECTOR

(75) Inventors: Chih-Ming Lai, Xindian (TW);
Hou-Yuan Lin, Xindian (TW);
Yung-Shun Kao, Xindian (TW);
Tse-Hsine Laio, Xindian (TW)

(73) Assignee: Giga-Byte Technology Co. Ltd., Taipei (TW)

( * ) Notice: Subject to any disclaimer, the term of this patent is extended or adjusted under 35 U.S.C. 154(b) by 0 days.

(21) Appl. No.: 11/413,088

(22) Filed: Apr. 28, 2006

(65) Prior Publication Data

US 2007/0254526 A1 Nov. 1, 2007

(51) Int. Cl.
*H01R 24/00* (2006.01)
(52) U.S. Cl. ..................................... 439/637
(58) Field of Classification Search ................ 439/188, 439/489, 637, 620.15
See application file for complete search history.

(56) References Cited

U.S. PATENT DOCUMENTS

| | | | | |
|---|---|---|---|---|
| 3,858,961 | A * | 1/1975 | Goodman et al. | 439/631 |
| 4,643,500 | A * | 2/1987 | Krumme | 439/161 |
| 4,790,762 | A * | 12/1988 | Harms et al. | 439/59 |
| 4,846,729 | A * | 7/1989 | Hikami et al. | 439/161 |
| 4,932,885 | A * | 6/1990 | Scholz | 439/79 |
| 5,713,747 | A | 2/1998 | Hsia et al. | |
| 6,036,548 | A * | 3/2000 | Braithwaite | 439/637 |
| 6,056,602 | A * | 5/2000 | Wu | 439/668 |
| 6,086,424 | A * | 7/2000 | Chang | 439/630 |
| 6,093,032 | A | 7/2000 | McHugh et al. | |
| 6,244,877 | B1 * | 6/2001 | Asao | 439/76.2 |
| 6,592,401 | B1 * | 7/2003 | Gardner et al. | 439/544 |
| 6,739,912 | B2 * | 5/2004 | Korsunsky et al. | 439/620.15 |
| 6,899,564 | B2 * | 5/2005 | Lee | 439/606 |
| 2006/0014438 | A1 * | 1/2006 | Regnier | 439/637 |

FOREIGN PATENT DOCUMENTS

| | | |
|---|---|---|
| TW | M271270 | 7/2005 |
| TW | I249976 | 2/2006 |

OTHER PUBLICATIONS

UK search report.

* cited by examiner

*Primary Examiner*—Briggitte Hammond
*Assistant Examiner*—Larisa Tsukerman

(57) ABSTRACT

A structure of an interface card connector includes a connector body and a plurality of terminals provided on the connector body. The bottom surface of the connector body is divided into a terminal zone and a space zone along the transverse direction. The distal ends of the terminals project from the terminal zone toward the bottom surface of the connector body. The space zone is recessed toward the connector body to form a notch portion, so that the bottom surface formed by the space zone is higher than that formed by the terminal zone. The space zone is used to provide a space for arranging the electronic components on the main board, so that more space on the main board is spared for the circuit layout. With this arrangement, the problem of the insufficient space and area of the main board can be solved.

3 Claims, 6 Drawing Sheets

STRUCTURE OF INTERFACE CARD CONNECTOR

BACKGROUND OF THE INVENTION

1. Field of the Invention

The present invention relates to an improved structure of an interface card connector capable of reducing the connecting portions between the terminals and the circuit board to produce more space and area for the layout of the main board or the arrangement of the electronic components.

2. Description of Prior Art

Generally, various interface cards, such as display card, network card or sound card, are inserted on the main board of a computer. In the connection between the interface card and the main board, an interface card connector is necessarily used to accomplish the transmission and communication of the signals.

With the rapid development in the processing speed of the current computer, the requirements for the functions of the display card are also raised. Accordingly, the area of the circuit board of the display card is increased. Also, in the corresponding interface card connector, the length of the slot inserted by the display card is increased therefore. When the length of the slot of the interface card connector is increased, the volume of the connector will be inevitably enlarged. Once the volume of the connector is enlarged, the enlarged connector necessarily occupies a larger space and area on the main board, causing the difficulty in the design and layout of the signal circuits on the main board.

Taiwan Patent Publication No. M271270 entitled "Improved structure of PCI interface card connector" and Taiwan Patent No. 1249976 entitled "Main board and PCI Express x16 slot of the same" are proposed to solve the above problems. Both patent documents employ a lower-level connector, such as 1×, 4× or 8×. On side of such kind of connector is provided with a notch in communication and linear alignment with the slot. A supporting piece is also used to fasten the upper and lower edges of the interface card to correspond to a longer 16× interface card. Although the above measure can reduce the occupied area of the circuit board, a portion of the gold finger unit of the interface card is exposed. As a result, the interface card is more likely to be oxidized. Further, since the connector and the supporting piece are designed separately, the connector and the supporting piece may be easily misaligned with each other due to the error in assembling on the circuit board, affecting the stability and smoothness of the insertion of the interface card. If the error is too large, the insertion of the interface card may not be allowed. As a result, the chance of low yield of the products is increased.

In view of the above, the inventor proposes the present invention to overcome the above problems based on his expert experiences and deliberate researches.

SUMMARY OF THE INVENTION

The present invention is to provide an improved structure of an interface card connector to solve the drawbacks of prior art. For example, with the increase in the functions of the interface card, the interface card connector is enlarged and thus occupies more space on the main board, causing the insufficiency in the space and area of the main board. Further, the present invention can simultaneously satisfy the high-level and low-level interface cards without affecting the functions of the interface card.

The present invention is to provide an improved structure of an interface card connector to achieve the above object. Further, the gold finger unit of the interface card can be entirely inserted into the slot to reduce the chance of oxidization. The assembling is simple without accurate alignment. Therefore, the interface card can be easily and stably inserted into the slot.

The present invention provides an improved structure of an interface card connector comprising a connector body extending in a transverse direction, a slot provided on the top surface of the connector body for the insertion of the interface card, and a plurality of terminal accommodating holes provided on both sides of the slot for accommodating a plurality of terminals in the terminal accommodating holes, respectively. The bottom surface of the connector body is divided into a terminal zone and a space zone along the transverse direction. The distal ends of the terminals project from the terminal zone toward the bottom surface of the connector body. The space zone is recessed toward the connector body to form a notch portion, so that the bottom surface formed by the space zone is higher than that formed by the terminal zone. Also, the space zone is used to provide a space for arranging the electronic components on the main board, so that more space on the main board is spared for the circuit layout. Therefore, a better and wider space for arranging the circuit board can be obtained.

DETAILED DESCRIPTION OF THE INVENTION

In order to make the Examiner better understand the characteristics and the technical contents of the present invention, a detailed description relating to the present invention will be made with reference to the accompanying drawings. However, it should be understood that the drawings are illustrative but not used to limit the scope of the present invention.

Figure 1:
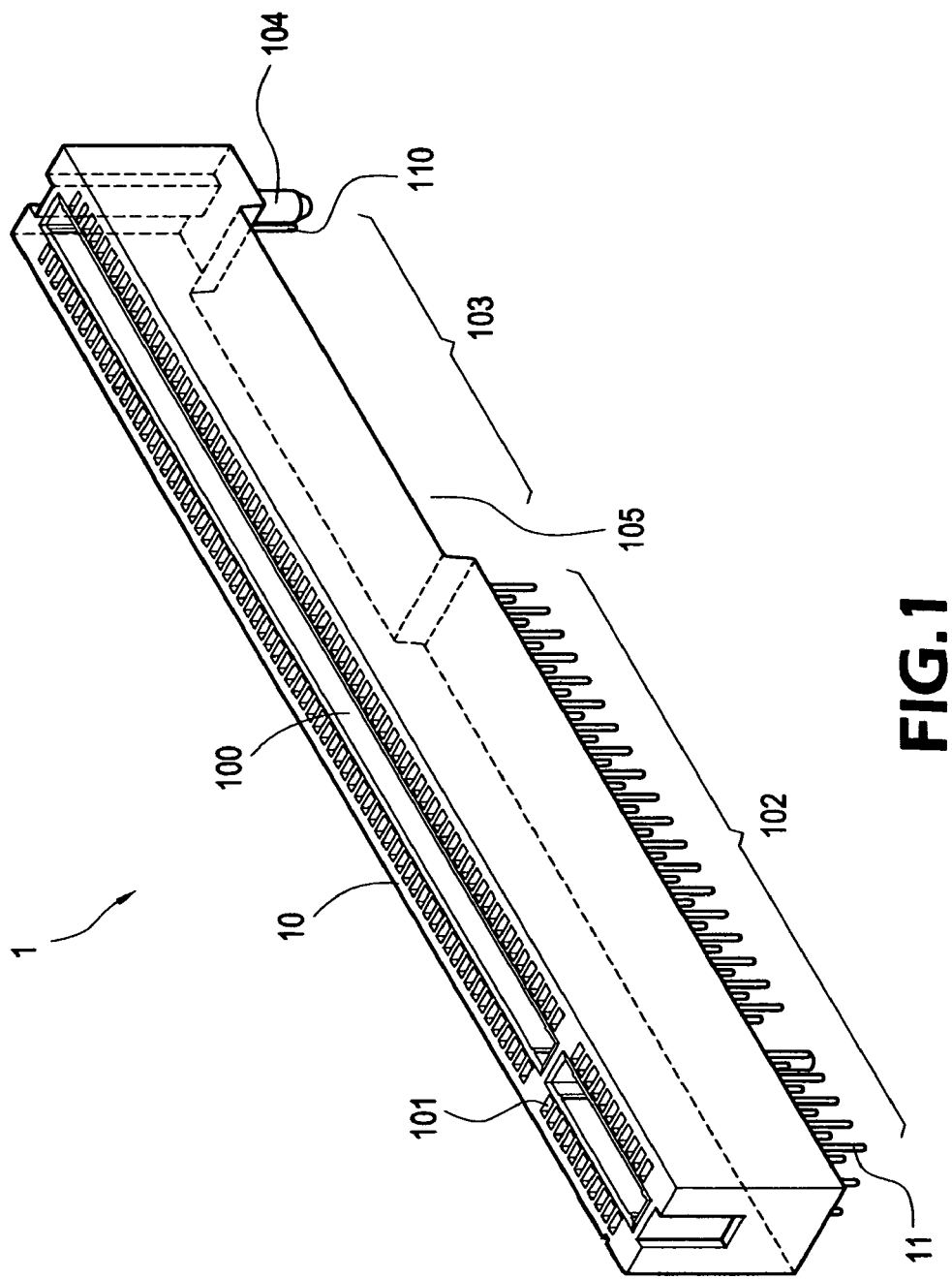
FIG. 1 is a perspective view showing the external appearance of the present invention.

FIG. 1 is a perspective view showing the external appearance of the present invention.

Figure 2:
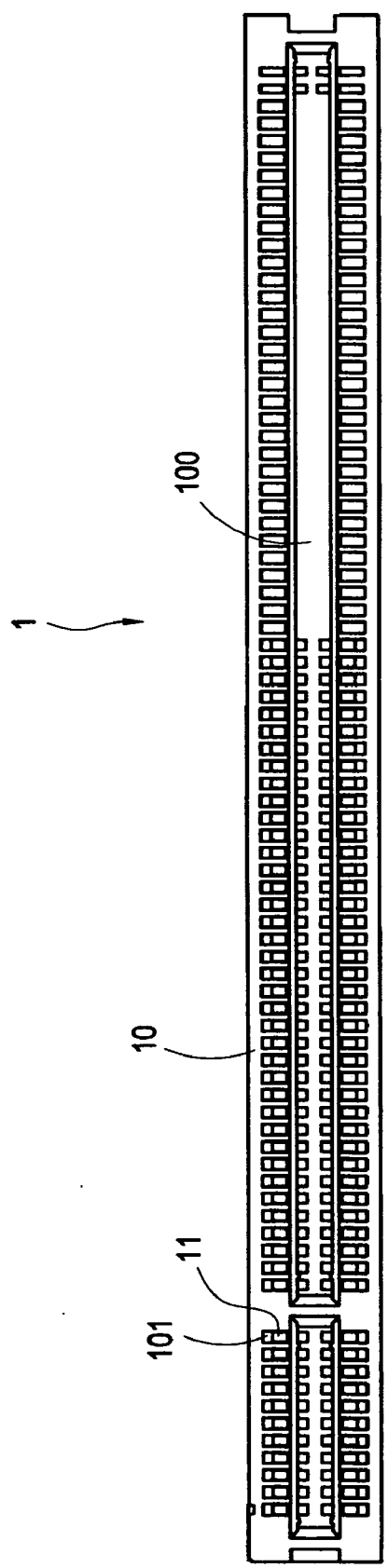
FIG. 2 is a top view of the present invention.
Figure 3:
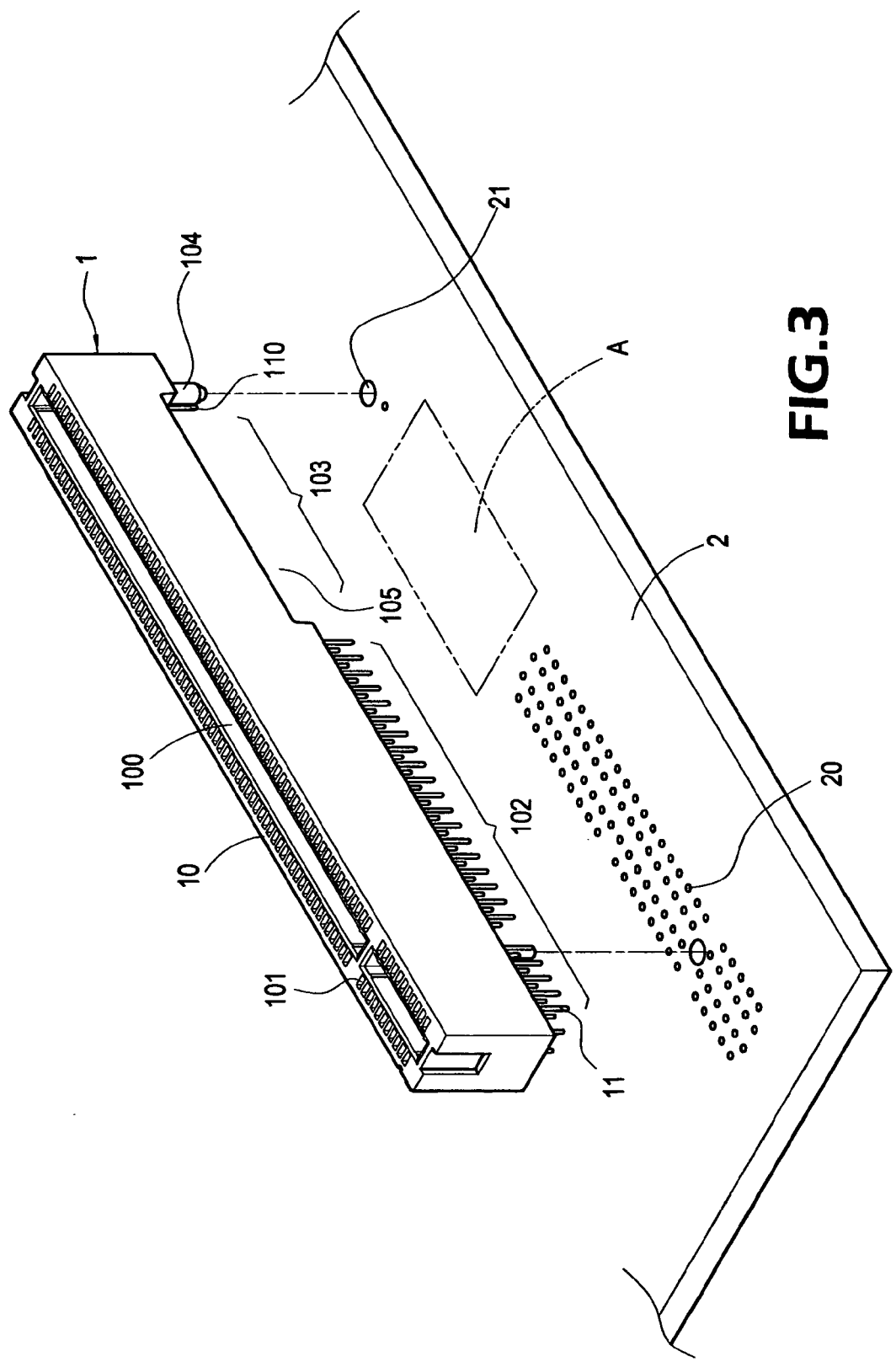
FIG. 3 is an exploded view showing the state in which the present invention is provided on a main board.

FIG. 2 is a top view of the present invention. FIG. 3 is an exploded view showing the state in which the present invention is provided on a main board. The present invention provides an improved structure of an interface card connector. The interface card connector 1 has a connector body 10 made of insulating materials, such as plastic. The connector body 10 is an elongated body extending in a transverse direction. The top surface of the connector body 10 is provided with at least one slot 100 recessed inwardly to a certain depth. The slot 100 can be inserted by the interface card and extends along the transverse direction of the connector body 10. Both sides of the slot 100 are provided with a plurality of terminal accommodating holes 101 for being inserted by a plurality of terminals.

As mentioned in the above, the bottom surface of the connector body 10 is used to adhere to the surface of a circuit board 2. The circuit board 2 can be a main board of a computer and is provided with a plurality of terminal holes 20. The distal ends of terminals can be inserted into the terminal holes and welded therein. The circuit board is provided with a positioning hole 21, so that a positioning post 104 projecting from the bottom surface of the connector body 10 can be inserted and positioned therein. The positioning post 104 is provided at one side of the bottom surface of the connector body 10. Adjacent to the positioning post 104, a detecting terminal 110 is provided.

Figure 4:
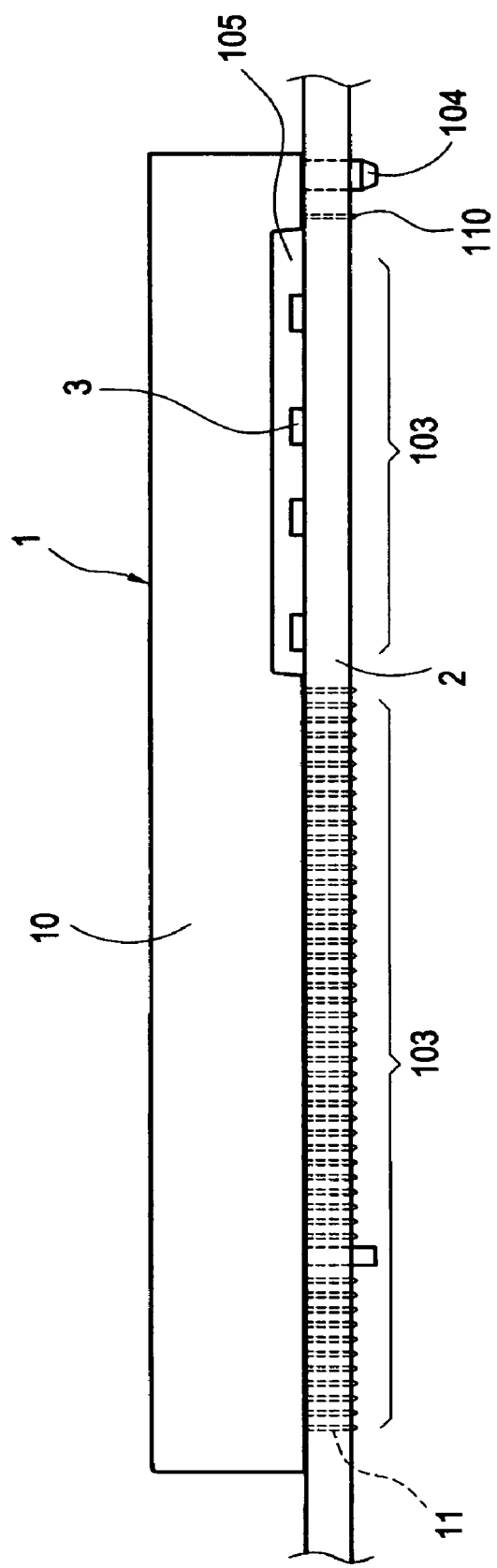
FIG. 4 is a plan view showing the state in which the present invention is provided on a main board.

In the present invention, the bottom surface of the connector body 10 is divided into a terminal zone 102 and a space zone 103 along the transverse direction. The distal ends of the terminals 11 provided in the terminal accommodating holes 101 project downwardly from the terminal zone 102. On the other hand, the space zone 103 is not provided with any terminal 11 and further recessed toward the connector body 10 to form a notch portion 105, so that the bottom surface formed by the space zone 103 is higher than that formed by the terminal zone 102 (as shown in FIG. 4). With this arrangement, when the connector body 10 is arranged on the circuit board 2, the electronic components 3 necessary for the circuit board can be arranged between the space zone 103 of the connector body 10 and the circuit board 2. Further, since there is no terminal 11 in the space zone 103, the portion of the circuit board 2 opposing to the space zone 103 is not necessary to provide with terminal holes 20. As a result, a surface area A enclosed by the dotted-line in FIG. 3 can be spared for the circuit layout of the main board. Therefore, a better and wider space for arranging the circuit board 2 can be obtained.

With the above arrangement, the improved structure of the interface card connector can be achieved.

Figure 5:
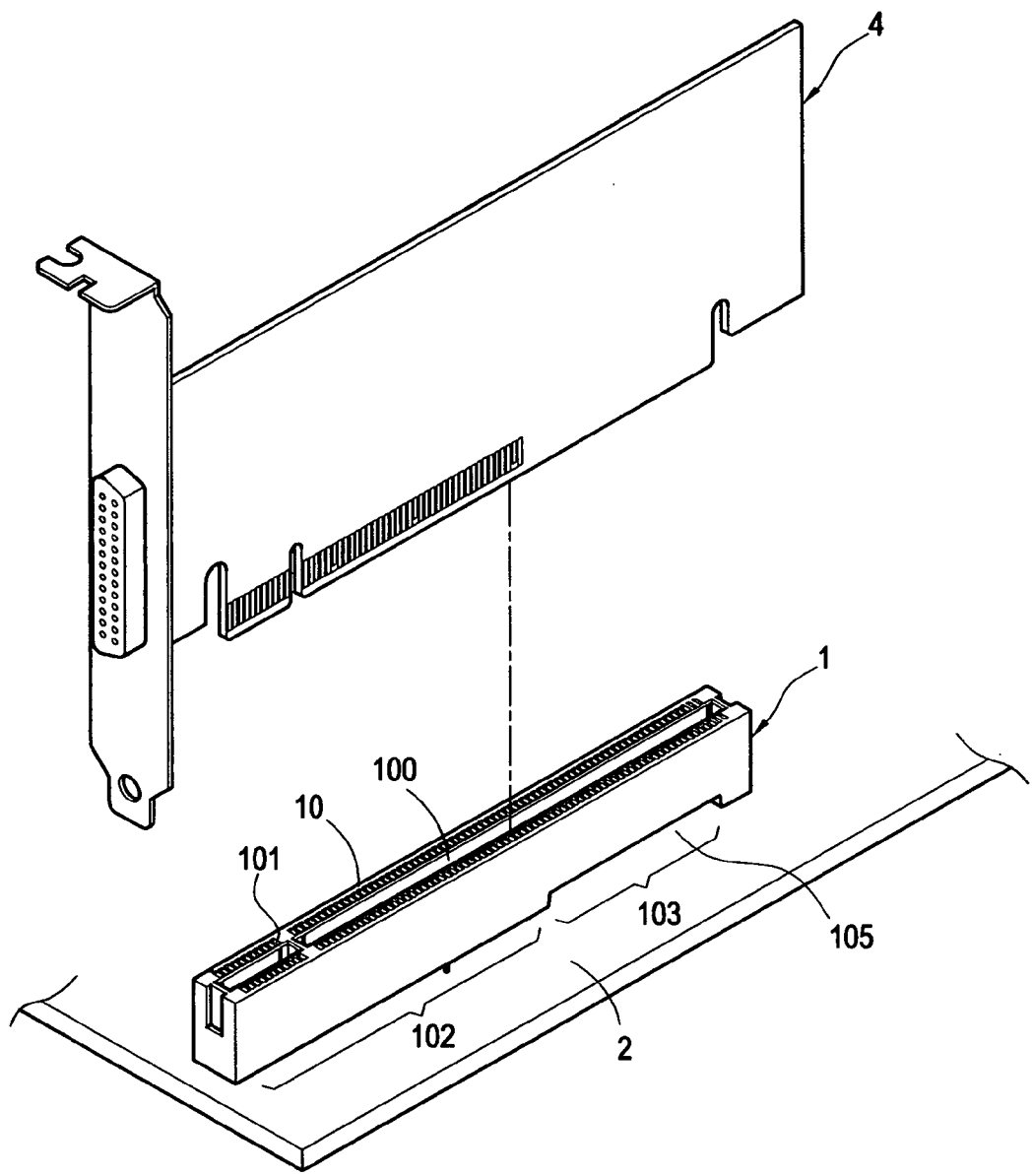
FIG. 5 is a plan view showing the state in which the present invention and an 8× interface card are provided on a main board.

FIG. 5 is a plan view showing the state in which the present invention and an 8× interface card are provided on a main board. Since the connector body 10 of the present invention aims to correspond to the connector of a 16× interface card, the redundant terminals are removed and only necessary terminals 11 are left. Therefore, in practice, the present invention also can be used to correspond to a low-level 8× interface card 4.

Figure 6:
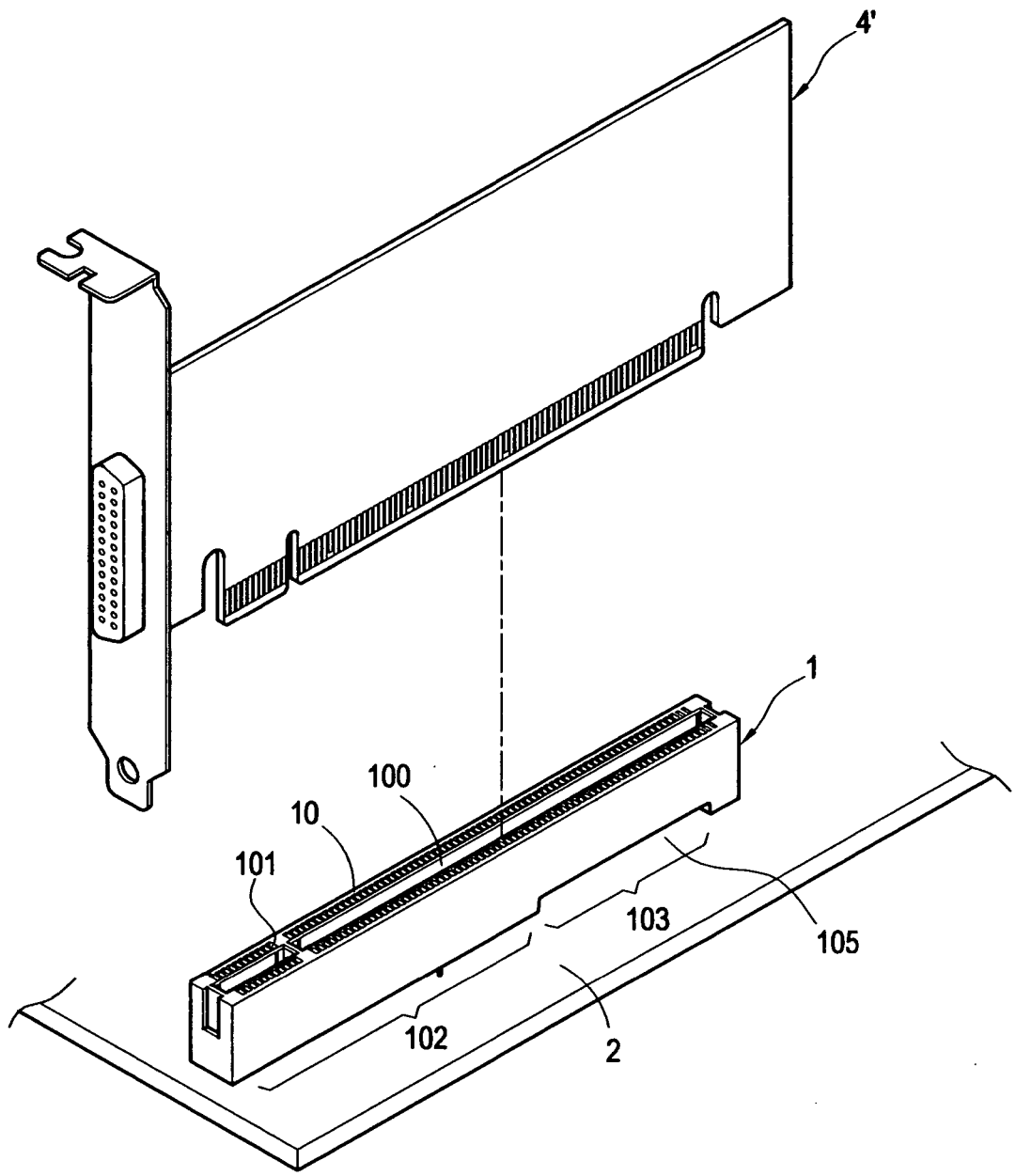
FIG. 6 is a plan view showing the state in which the present invention and a 16× interface card are provided on a main board.

FIG. 6 is a plan view showing the state in which the present invention and a 16× interface card are provided on a main board. With the modification in the design of signal circuits, the present invention effectively uses the limited space and area of the circuit board 2 without affecting the functions of the 16× interface card 4'.

Therefore, with the improved structure of the interface card connector of the present invention, the circuit board can be used to simultaneously correspond to an 8× interface card 4 and a 16× interface card 4'. Further, the space zone 103 can be used to arrange the electronic components necessary for the main board without affecting the functions of the 16× interface card 4'. Also, the surface area A formed by the space zone 103 increases the elasticity of the circuit layout on the main board. As a result, the stability of the circuit board 2 is enhanced but the design cost is reduced. In comparison with the separated design of the existing connector and the supporting piece, the integrated design of the connector body 10 of the present invention can avoid the gold finger unit on the interface card 4, 4' from being oxidized. Therefore, when being assembled on the circuit board 2, the interface card 4, 4' can be smoothly inserted into the connector to form a stable connection without a relatively accurate alignment. Accordingly, the chance of low yield of the products is greatly reduced.

According to the above, the present invent indeed achieves the desired effects and overcomes the drawbacks of prior art by employing the above structures. Therefore, the present invention involves the novelty and inventive steps, and conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A structure of an interface card connector installed on a circuit board of a computer for receiving an interface card connected thereon, comprising a connector body extending in a transverse direction, the connector body being divided into a terminal zone and a space zone along the transverse direction, an elongated slot provided on the top surface of the terminal zone and the space zone of the connector body for the insertion of the interface card, and a plurality of terminal accommodating holes provided on both sides of the whole slot along the transverse direction for accommodating a plurality of terminals in the terminal accommodating holes formed in the terminal zone, respectively, wherein the distal ends of the terminals protrude from the bottom surface of the terminal zone of the connector body to be inserted into and welded in a plurality of terminal holes provided on the circuit board, respectively, and the bottom surface of the space zone is recessed inwardly to form a notch portion, so that the bottom surface formed by the space zone is higher than that formed by the terminal zone to have the bottom surface of the terminal zone adhere on the circuit board and the bottom surface of the space zone stand off the circuit board after the connector body is attached to the circuit board.

2. The structure of an interface card connector according to claim 1, wherein one side of the bottom surface of the connector body is provided with a positioning post.

3. The structure of an interface card connector according to claim 2, wherein a detecting terminal is provided adjacent to the positioning post of the connector body.

* * * * *